(12) United States Patent
Kumar et al.

(10) Patent No.: US 6,737,753 B2
(45) Date of Patent: May 18, 2004

(54) BARRIER STACK

(75) Inventors: Senthil Kumar, Singapore (SG); Chua Soo Jin, Singapore (SG); Mark Auch, Singapore (SG); Ewald Guenther, Singapore (SG)

(73) Assignees: Osram Opto Semiconductor GmbH, Regensburg (DE); Institute of Materials Research and Engineering, Singapore (SG)

( * ) Notice: Subject to any disclaimer, the term of this patent is extended or adjusted under 35 U.S.C. 154(b) by 0 days.

(21) Appl. No.: 09/968,189

(22) Filed: Sep. 28, 2001

(65) Prior Publication Data

US 2003/0062527 A1 Apr. 3, 2003

(51) Int. Cl.⁷ .............................................. H01L 23/48
(52) U.S. Cl. ........................ 257/787; 257/758; 257/780
(58) Field of Search ............................ 257/79, 48, 98, 257/103, 310, 758, 787, 779, 780, 781; 430/200; 313/512, 506

(56) References Cited

U.S. PATENT DOCUMENTS

| 5,920,080 | A | * | 7/1999 | Jones | ........................... 257/40 |
|---|---|---|---|---|---|
| 6,244,441 | B1 | | 6/2001 | Ahlgren | |
| 6,291,126 | B2 | * | 9/2001 | Wolk et al. | .................. 430/200 |
| 6,333,537 | B1 | * | 12/2001 | Arita | ........................... 257/310 |
| 6,522,067 | B1 | * | 2/2003 | Graff et al. | .................. 313/512 |
| 6,570,325 | B2 | * | 5/2003 | Graff et al. | .................. 313/506 |

FOREIGN PATENT DOCUMENTS

| JP | 11 121171 | 4/1999 |
|---|---|---|
| WO | WO 00/36665 | 6/2000 |
| WO | WO 00/65670 | 11/2000 |
| WO | WO 01/05205 | 1/2001 |
| WO | WO 01/89006 | 11/2001 |

* cited by examiner

*Primary Examiner*—Long Pham
*Assistant Examiner*—Hoa B. Trinh
(74) *Attorney, Agent, or Firm*—Fish & Richardson P.C.

(57) ABSTRACT

A barrier stack for sealing devices is described. The barrier stack includes at least first and second base layers bonded together with a high barrier adhesive. A base layer includes a flexible support coated on at least one major surface with a barrier layer. The adhesive advantageously seals defects, such as pinholes in the barrier layer, thus improving the barrier properties.

60 Claims, 7 Drawing Sheets

BARRIER STACK

FIELD OF THE INVENTION

The present invention relates generally to encapsulating or sealing of devices, such as organic light emitting diode (OLED) devices.

BACKGROUND OF THE INVENTION

FIG. 1 shows an OLED device 100 which serve, for example, as a display in various types of consumer electronic products, including cellular phones, cellular smart phones, personal organizers, pagers, advertising panels, touch screen displays, teleconferencing and multimedia products, virtual reality products, and display kiosks.

The OLED device comprises a functional stack formed on a substrate 101. The functional stack comprises of one or more organic functional layers 110 between two conductive layers 105 and 115 which serve as electrodes (cathode and anode). The conductive layers are patterned as desired, for example, to form a pixelated, a segmented, or other types of devices. Charge carriers are injected through the cathodes and anodes via bond pads 150 for recombination in the functional layers. The recombination of the charge carriers causes the functional layer to emit visible radiation. The device is encapsulated with a cap 160. OLED devices require hermetic sealing since the active components, such as the cathode, are adversely impacted by moisture and oxygen.

Flexible OLED devices formed on polymeric substrates have been investigated. Due to low barrier performance of the polymeric material to moisture and oxygen, the substrate needs to be coated with a barrier. Typically the barrier comprises oxide or nitrides, such as aluminum oxide, silicon oxide, or silicon nitride. The barrier layer is formed on the polymeric substrate by physical vapor deposition (PVD) or chemical vapor deposition (CVD). When a barrier layer is deposited on a polymeric material, imperfections such as pinholes, cracks, and grain boundaries occur. Such imperfections adversely impact the barrier characteristics of the barrier layer. Multiple metal oxide layers have been proposed to improve barrier performance. However, the use of multiple metal oxide layers still has not satisfied the barrier performance necessary for OLED devices because pinholes or imperfections tend to propagate to the subsequent layers.

As evidenced from the foregoing discussion, it is desirable to provide improved barrier for OLED devices, particularly for flexible OLED devices.

SUMMARY OF THE INVENTION

The invention relates to a barrier stack for improved sealing of a device, such as an OLED device. The barrier stack comprises first and second base layers. The first base layer includes a flexible substrate having at least one of its surfaces coated with a barrier layer. The second base layer includes a flexible substrate having at least one of its surfaces coated with a barrier layer. The base layers are bonded together with a high barrier adhesive. In another embodiment, the barrier layer is coated with a liner layer to seal the micro and nano defects on the barrier layer to enhance the barrier property of the barrier stack. In yet another embodiment, a foil, such as aluminum or copper, is provided between the base layer.

PREFERRED EMBODIMENTS OF THE INVENTION

In accordance with the invention, an improved barrier stack is provided. The barrier stack serves to improve hermetic sealing of devices cost effectively. Additionally, the barrier stack can be used as a substrate on which active components of devices can be fabricated as well as a device package. Although the invention is described in the context of an OLED device, it is generally applicable for other types of devices, particularly those which require hermetic sealing to protect the components from the environment.

Figure 1:
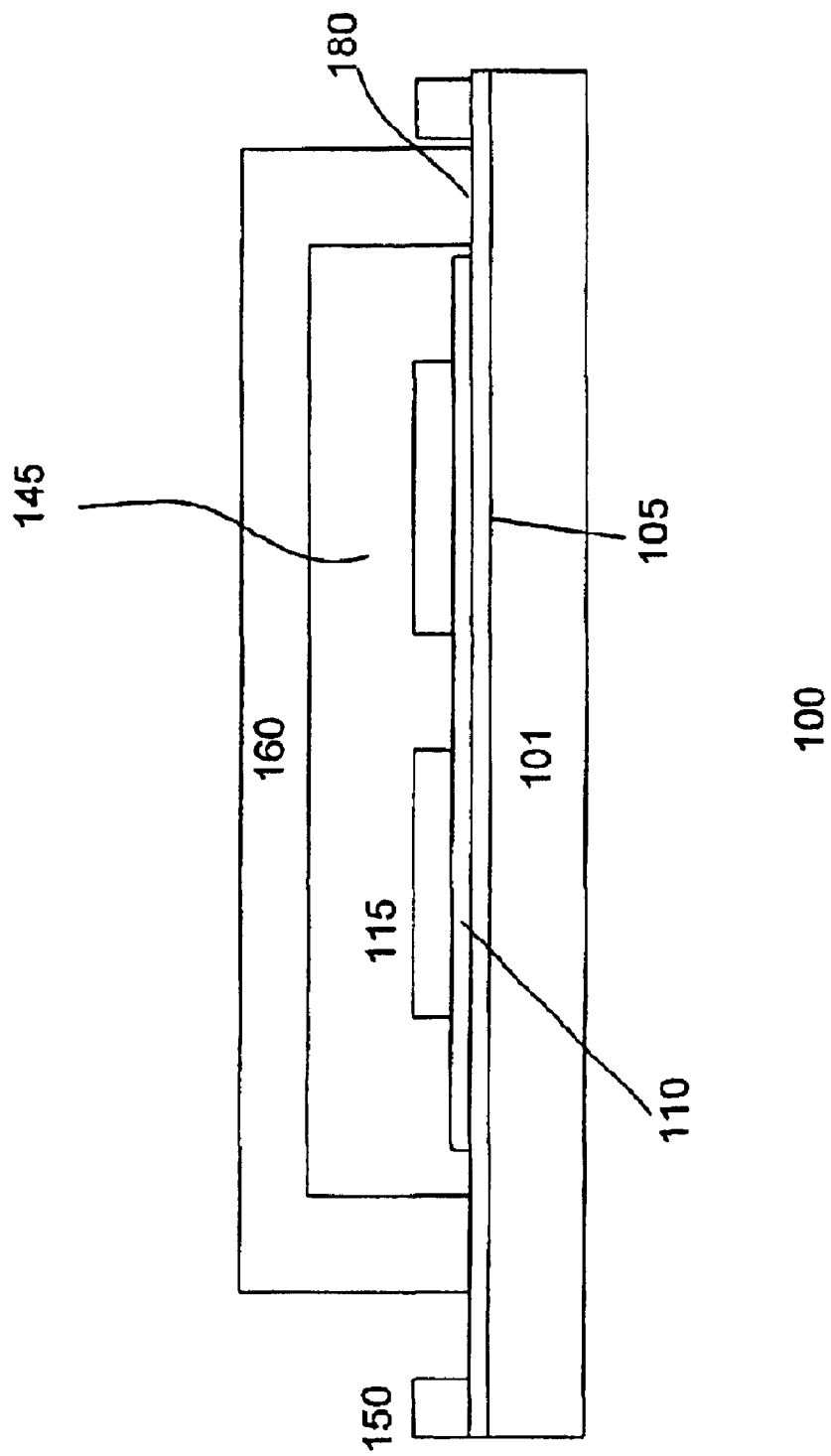
FIG. 1 shows a conventional OLED device.
Figure 2:
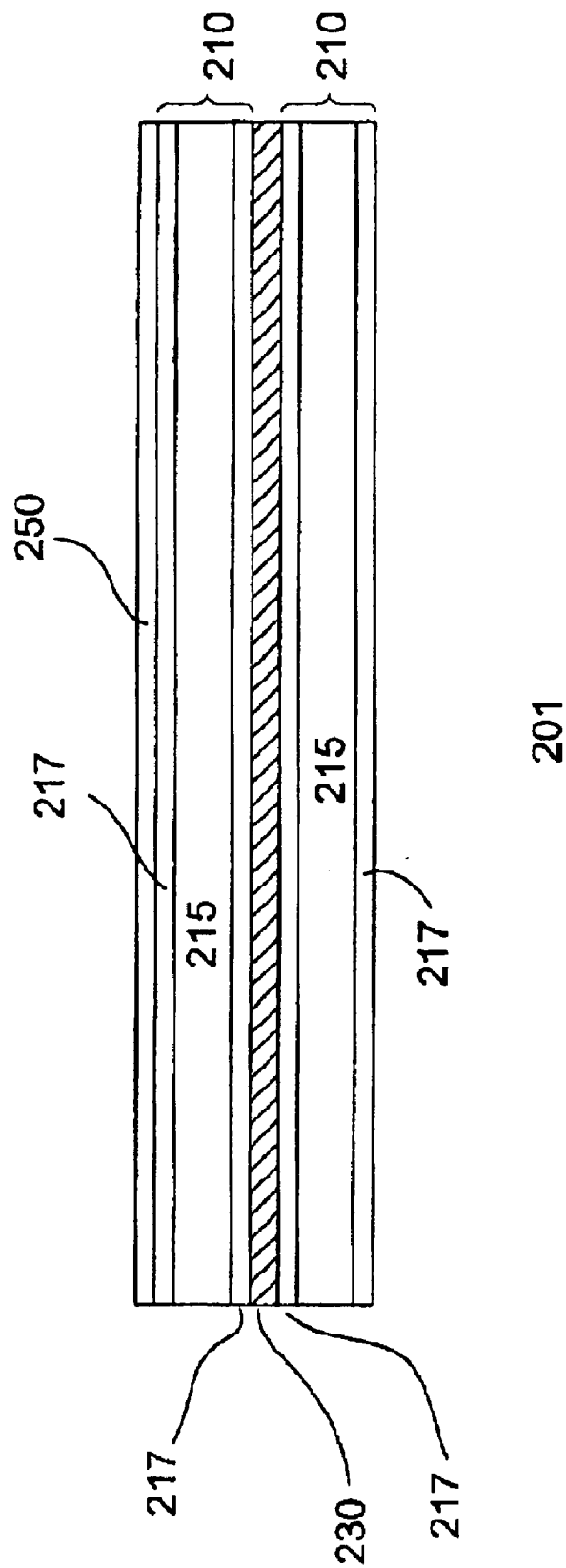
FIGS. 2–4 show barrier stacks in accordance with various embodiments of the invention.

Referring to FIG. 2, a barrier stack 201 in accordance with one embodiment of the invention is shown. The barrier stack comprises a plurality of base layers 210 bonded together. As shown, the barrier stack includes first and second base layers. Barrier stacks with more than two base layers are also useful. In one embodiment, a base layer comprises a flexible support or substrate 215. The flexible substrate is formed from, for example, polymeric material such as polyester, polyethylene glycol terephthalate (PET), polypropylene, and polyamide such as nylon, PEN, PES, or PC. Other flexible materials can also be used to form the flexible substrate. Polymeric materials advantageously enable fabricating of devices using a roll-to-roll process.

At least one major surface of the support layer is coated with a barrier layer 217 for inhibiting the passage of moisture or oxygen therethrough. Preferably, the flexible substrate is coated on both major surfaces with a barrier layer. Providing a combination of support layers where some are coated on one major surface and other coated on both surfaces is also useful. Typically, the barrier layer comprises a metal oxide such as, for example, aluminum oxide or silicon oxide. Other materials such as nitrides can also be used to form the barrier layer. Various conventional techniques can be used to form the barrier layer on the plastic support layer. Such techniques include, for example, sputtering, electron beam evaporation, plasma evaporation or chemical vapor evaporation or plasma polymerization.

The flexible substrate and barrier layers are formed from, for example, transparent materials. The use of transparent materials allows the OLED device to be viewed through the barrier stack. Non-transparent materials can also be used to from the barrier stack, particularly for applications which do not require transparency.

If the barrier stack serves as the substrate or support on which OLED devices are fabricated, a conductive layer 250 is deposited on its upper surface. For example, the conductive layer is deposited on the barrier layer. The conductive layer serves as an electrode of the OLED device. In one embodiment, the conductive layer comprises a transparent conductive layer formed from indium tin oxide (ITO). Other types of conductive materials, such as indium zinc oxide (IZO) or zinc oxide (ZO), are also useful to form the conductive layer. Various conventional techniques including sputtering, PVD or CVD vacuum processes can be used to form the conductive layer. The conductive layer can be patterned as desired to form, for example, the anode or anodes of the OLED device.

Figure 3:
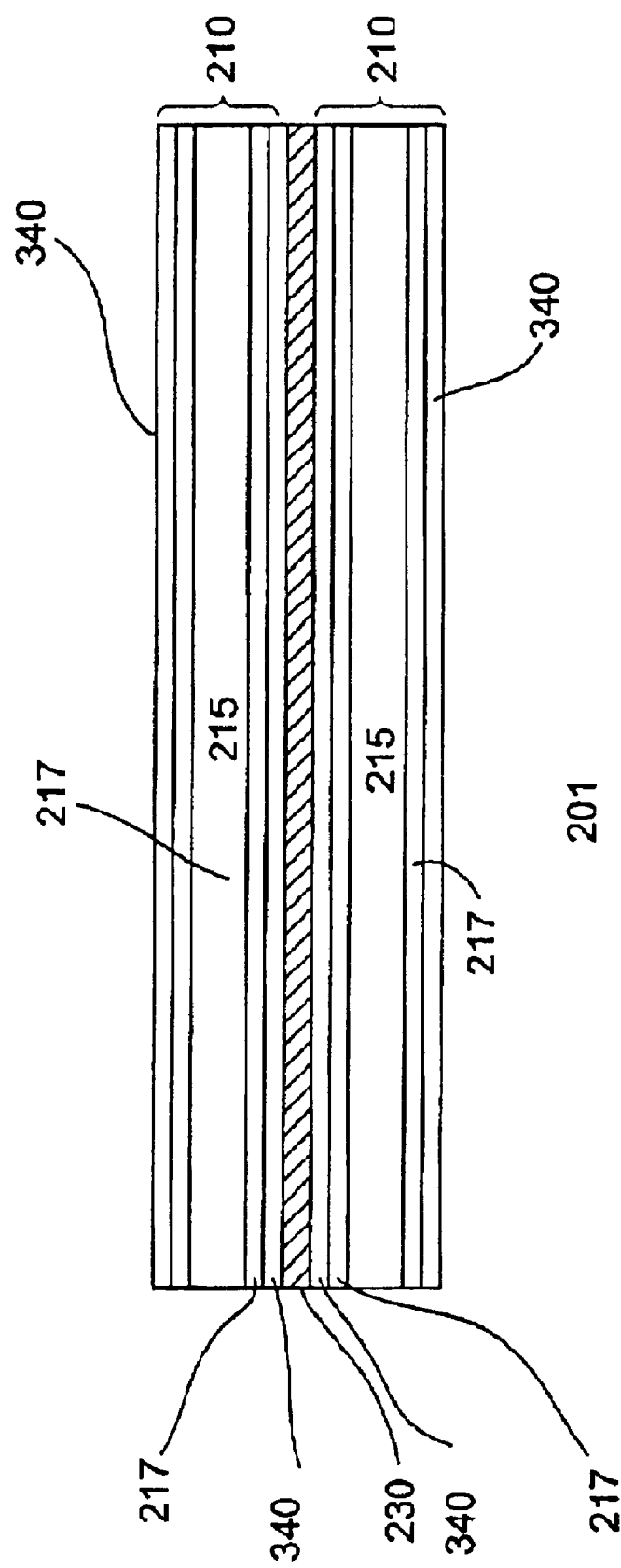

In an alternative embodiment, as shown in FIG. 3, a liner 340 can be deposited on the barrier layer to provide a lined barrier layer. The liner layer provides surface smoothness as well as sealing micro and nano defects in the barrier layer. In one embodiment, the liner layer comprises an organic material such as acrylic. Epoxy-based (e.g., heat or UV cured epoxy-based hard coat), silicone-based, or parylene types of materials are also useful to serve as the liner layer. The organic material can be deposited on the barrier layer using various conventional techniques such as CVD, vacuum evaporation, spin coating or lamination. Additional barrier layers with a liner layer between two barrier layers can also be provided. However, it is not necessary that the final layer of the stack is a liner layer.

In one embodiment, the base layers are bonded together with an adhesive 230. The adhesive can comprises a high barrier adhesive such as UV or heat cured laminating epoxy. Other types of high barrier adhesives are also useful. The adhesive seals imperfections in the barrier layers, thus improving the barrier performance of the barrier layers. Tests have shown that the barrier layer performance can be enhanced by 10 to 100 folds as compared to base layers which are not bonded with an adhesive. The base layers can be bonded using conventional lamination techniques such as UV or heat curing adhesive bonding.

The base layers can be bonded together in any configuration. For example, the base layers can all be coated on both major surfaces with the barrier layer, on just one major surface, or a combination of one and both major surfaces. Preferably, the base layers are bonded such that at least a barrier layer of one of the two adjacent base layers is in contact with the adhesive. For example, if only one major surface of the base layers is coated, the barrier layer (or liner layer if barrier layer is coated) of one of the base layer is bonded to the flexible substrate of the other base layer. Bonding barrier layer of one base layer to the barrier layer of the other base layer is also useful. If the barrier stack is used as the substrate for forming OLEDs, the base layers are bonded to provide the conductive layer on the upper surface of the barrier stack. Alternatively, the conductive oxide layer (e.g., ITO) can be formed on the upper surface of the barrier stack after the base layers are bonded together.

Figure 4:
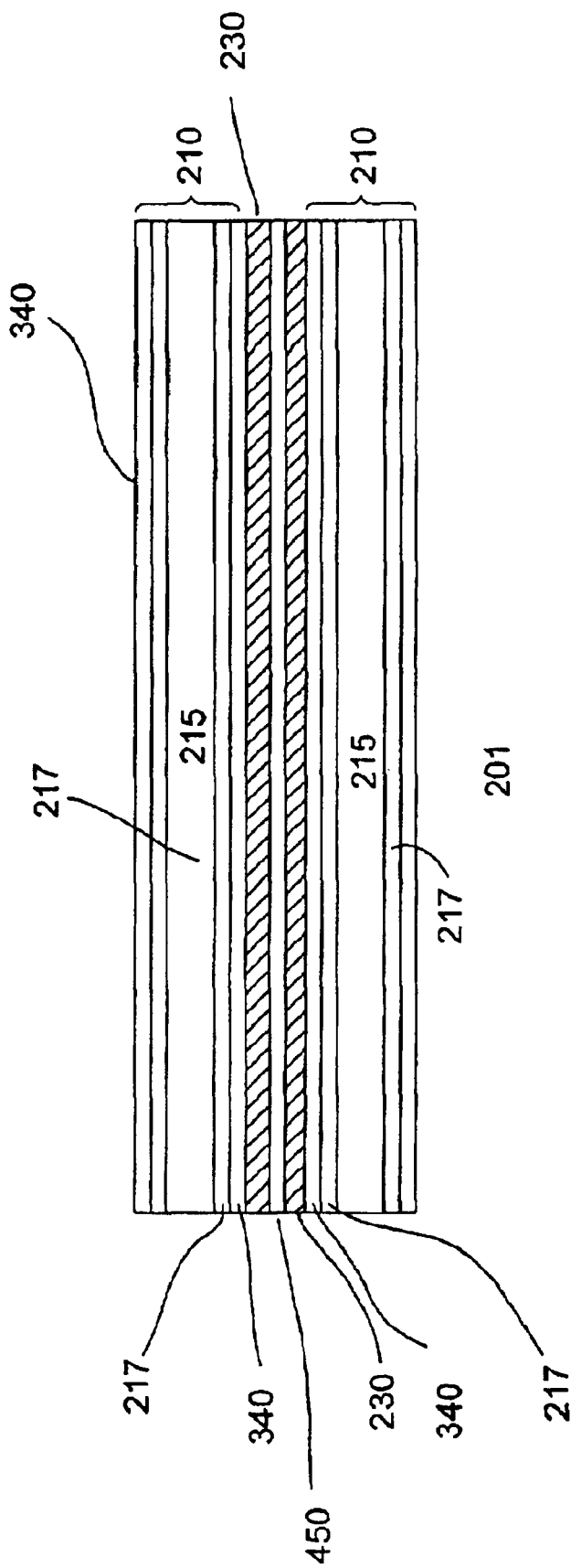

Optionally, a foil 450 can be provided between two base layers, as shown in FIG. 4. The foil, in one embodiment, comprises aluminum. Other types of foils, such as copper, are also useful. The foil further improves the barrier properties of the barrier stack since it generally does not have any defects such as pinholes or pores. Furthermore, the foil has high flexibility after lamination. The thickness of the foil, for example, is less than 200 um.

Figure 5:
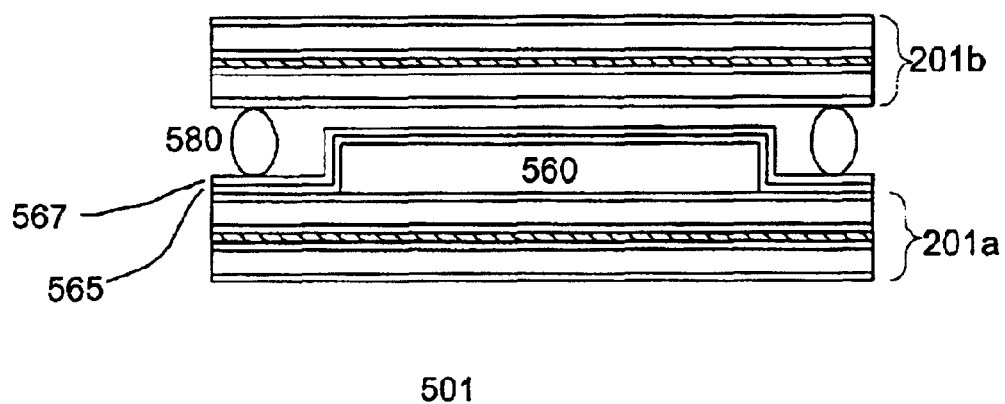
FIG. 5 shows an OLED device in accordance with one embodiment of the invention.

FIG. 5 shows an OLED device in accordance with one embodiment of the invention. A barrier stack 201*a* serves as the substrate on which OLED active components 560 are formed using conventional techniques. Such techniques are described in, for example, U.S. Pat. No. 4,720,432 and Burroughes et. al, Nature 347 (1990) 539, which are herein incorporated by reference for all purposes. The OLED active components include, for example, OLED pixels or segments. A protective organic and barrier layers 565 and 567 can be provided over the OLED active components. In one embodiment, the protective organic layer comprises an acrylic-based hard coat while the barrier layer comprises a metal oxide. Other types of organic protective and barrier layers can also be used.

A second barrier stack 201*b* is bonded to the barrier stack 201*a* with an adhesive 580, encapsulating the OLED components. Various types of adhesives, such as UV cured epoxy, heat cured epoxy, UV and heat cured epoxy, or any other acrylic based high barrier adhesives, can be used.

Figure 6:
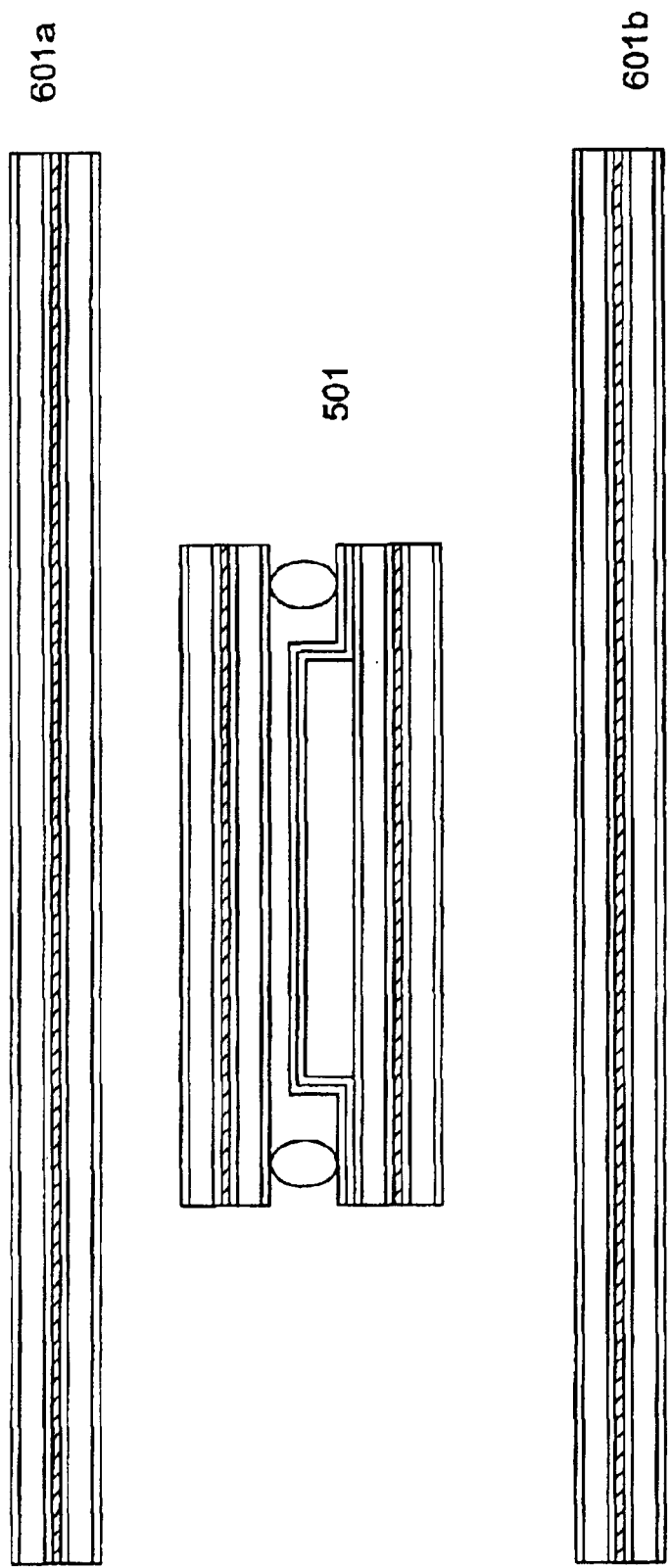
FIGS. 6–7 show an OLED device in accordance with another embodiment of the invention.
Figure 7:
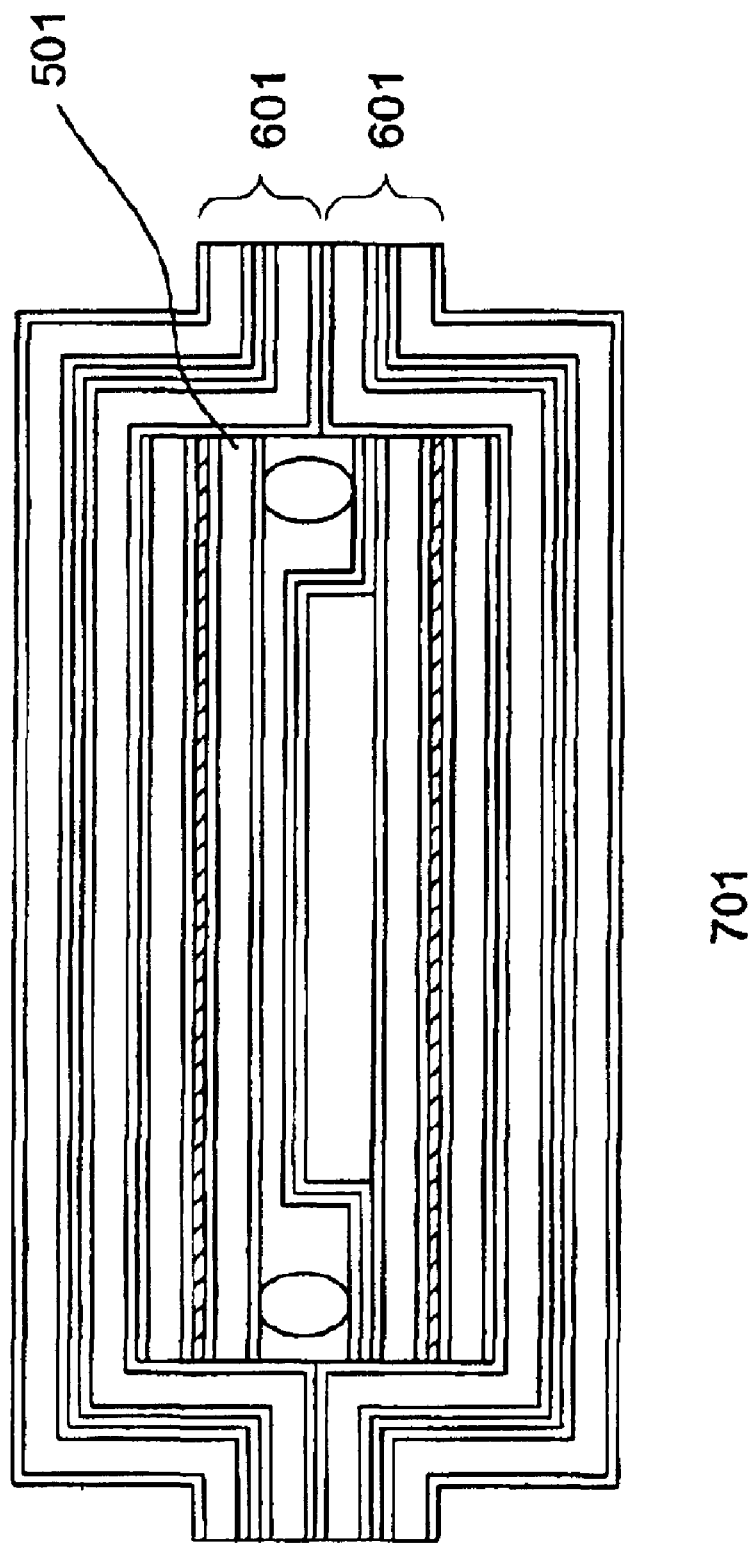

FIGS. 6–7 show a secondary encapsulation for the OLED device 501 in accordance with one embodiment of the invention. Referring to FIG. 6, first and second barrier stacks 601*a–b*, which are larger than the OLED device, are provided. The barrier stacks are laminated together, as shown in FIG. 7, using conventional lamination techniques. Preferably, the barrier stacks are laminated with a high barrier adhesive. The secondary encapsulation surrounds the sides of the OLED device, thus preventing permeation of moisture or oxygen therethrough.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   active electrical components; and
   a first barrier stack providing support to the active electrical components, the first barrier stack comprising:
   a first base layer having
   a first flexible substrate with first and second opposite surfaces,
   a first barrier layer directly adjacent to the first surface and a second barrier layer directly adjacent to the second surfaces of the first substrate,
   the first base layer having a first side, wherein the active electrical components are positioned on the first side;
   a second base layer having
   a second flexible substrate with first and second opposite surfaces,
   a third barrier layer directly adjacent to the first surface and a fourth barrier layer directly adjacent to the second surfaces of the second substrate; and
   an adhesive layer interposed between the first base layer and the second base layer, sealing imperfections in at least one of the first base layer or the second base layer.

2. The device of claim 1 wherein the first and second surfaces of the first flexible substrate of the first base layer are coated with the first and second barrier layers.

3. The device of claim 2 wherein at least one of the first and second barrier layers of one of the base layers contacts the adhesive layer.

4. The device of claim 3 wherein the first and second barrier layers comprise a barrier material which inhibits the diffusion of oxygen and moisture.

5. The device of claim 4 wherein the adhesive layer comprises a high barrier adhesive that seals imperfections in the barrier layer or barrier layers to which the adhesive contacts.

6. The device of claim 4 wherein at least one of the first and second barrier layers comprises a liner layer lining the top of the first and second barrier layer to form a lined barrier layer.

7. The device of claim 3 wherein the barrier material is selected from the group comprising metal oxides including aluminum oxide, silicon oxide, and nitrides.

8. The device of claim 7 wherein at least one of the first and second barrier layers comprises a liner layer lining the top of the first and second barrier layer to form a lined barrier layer.

9. The device of claim 3 wherein the adhesive layer comprises a high barrier adhesive that seals imperfections in the barrier layer or barrier layers to which the adhesive contacts.

10. The device of claim 2 wherein the adhesive layer comprises a high barrier adhesive that seals imperfections in the barrier layer or barrier layers to which the adhesive contacts.

11. The device of claim 2 wherein at least one of the barrier layers comprises a liner layer lining the top of the barrier layer to form a lined barrier layer.

12. The device of claim 2 wherein the barrier layers comprise a barrier material which inhibits the diffusion of oxygen and moisture.

13. The device of claim 2 wherein the barrier material is selected from the group comprising metal oxides including aluminum oxide, silicon oxide, and nitrides.

14. The device of claim 2 wherein the first and second surfaces of the second flexible substrate are coated with the third and fourth barrier layers.

15. The device of claim 14 wherein the third and fourth barrier layers comprise a barrier material which inhibits the diffusion of oxygen and moisture.

16. The device of claim 15 wherein the adhesive layer comprises a high barrier adhesive that seals imperfections in the barrier layer or barrier layers to which the adhesive contacts.

17. The device of claim 15 wherein at least one of the third and fourth barrier layers comprises a liner layer lining the top of the third and fourth barrier layer to form a lined barrier layer.

18. The device of claim 14 wherein the barrier material is selected from the group comprising metal oxides including aluminum oxide, silicon oxide, and nitrides.

19. The device of claim 18 wherein the adhesive layer comprises a high barrier adhesive that seals imperfections in the barrier layer or barrier layers to which the adhesive contacts.

20. The device of claim 18 wherein at least one of the third and fourth barrier layers comprises a liner layer lining the top of the third and fourth barrier layer to form a lined barrier layer.

21. The device of claim 14 wherein the adhesive layer comprises a high barrier adhesive that seals imperfections in the barrier layer or barrier layers to which the adhesive contacts.

22. The device of claim 1 wherein the flexible substrates comprise a polymeric material.

23. The device of claim 1 wherein the flexible substrates comprise a transparent flexible material.

24. The device of claim 1 wherein at least one of the first, second, third or fourth barrier layers comprises a liner layer lining the top of the barrier layer to form a lined barrier layer.

25. The device of claim 1 wherein the adhesive layer comprises a high barrier adhesive that seals imperfections in the barrier layer or barrier layers to which the adhesive contacts.

26. The device of claim 1 wherein the adhesive layer comprises epoxy.

27. The device of claim 1 wherein the active electrical components comprise an organic light emitting diode device.

28. The device of claim 1 wherein the device further comprises a second barrier stack which serves as a cap for encapsulating the active electrical components.

29. The device of claim 28 wherein the device comprises an organic light emitting diode device.

30. The device of claim 28 wherein two additional barrier stacks which are larger than the active electrical components are bonded together with the active electrical components therebetween to serve as a package for the active electrical components.

31. The device of claim 30 wherein the active electrical components comprise an organic light emitting diode device.

32. The device of claim 1 wherein two additional barrier stacks which are larger than the active electrical components are bonded together with the active electrical components therebetween to serve as a package for the active electrical components.

33. The device of claim 1 wherein the device comprises an organic light emitting diode device.

34. The device according to claim 1, wherein:
the adhesive layer directly contacts the first base layer and the second base layer.

35. The device according to claim 1, wherein:
the adhesive layer directly contacts the first barrier layer of the first base layer and the third barrier layer of the second base layer.

36. The device according to claim 1, wherein:
at least one metal foil is arranged between the first base layer and the second base layer.

37. The device according to claim 36, wherein:
the metal foil includes aluminum or copper.

38. The device according to claim 1, wherein:
the adhesive layer comprises UV or heat cured laminating epoxy.

39. A device comprising:

active electrical components; and a first barrier stack that provides a substrate to support the active electrical components, the first barrier stack consisting of:
  a first base layer having a first flexible substrate with a first surface on a first side of the first flexible substrate and a second surface on an opposite second side of the first flexible substrate, a first barrier layer directly adjacent to the first surface and a second barrier layer directly adjacent to the second surfaces, wherein the active electrical components are positioned on the first side of the first flexible substrate;
  a second base layer having a second flexible substrate with a first surface on a first side of the second flexible substrate and a second surface on an opposite second side of the second flexible substrate, a third barrier layer directly adjacent to the first surface and a fourth barrier layer directly adjacent to the second surfaces of the second flexible substrate,
  wherein the second base layer is positioned on the second side of the first base layer; and
  an adhesive layer interposed between the first base layer and the second base layers and sealing imperfections in at least one of the first base layer and the second base layer.

40. A device, comprising:

a first flexible substrate;

active components formed on the first flexible substrate; and a cap encapsulating the active components on the first flexible substrate, wherein said first flexible substrate is a first barrier stack, protecting the active components from oxygen and moisture, comprising:
  a first base layer having
    a second flexible substrate with first and second opposite surfaces,
    wherein a first barrier layer is directly adjacent to the first and a second barrier layer is directly adjacent to the second opposite surfaces;

a second base layer having
a third flexible substrate with first and second opposite surfaces, wherein a third barrier layer is directly adjacent to the first surface and a fourth barrier layer is directly adjacent to the second opposite surfaces; and
an adhesive layer interposed between the first base layer and the second base layer and sealing imperfections in at least one of the first base layer and the second base layer.

41. The device according to claim 40, wherein the second and third flexible substrates are selected from a group comprising a polymeric material.

42. The device according to claim 40, formed as an organic light emitting diode device, wherein the active components are a functional stack, comprising:
a first conductive layer formed on the first flexible substrate;
at least one organic functional layer formed on the first conductive layer; and
a second conductive layer formed on at least one organic functional layer.

43. The device according to claim 40, wherein at least one of the first and second barrier layers is selected from a group comprising metal oxides, aluminum oxide, silicon oxides and nitrides.

44. The device according to claim 40, wherein at least one of the first and second barrier layers comprises a liner layer lining the top of the barrier layer to form a lined barrier layer.

45. The device according to claim 44, wherein the liner layer is selected from a group comprising acrylic material, epoxy-based hard coat, silicone-based material and parlyenes.

46. The device according to claim 40, wherein the cap is a second barrier stack.

47. The device according to claim 40, wherein the adhesive layer comprises is a high barrier adhesive, selected from a group comprising UV cured epoxy, heat cured epoxy and UV and heat cured epoxy.

48. The device according to claim 46, further comprising two additional barrier stacks, which are larger than the first and second barrier stacks and which are bonded together, serving as a package for the first and second barrier stacks.

49. The device according to claim 46, wherein the device is an organic light emitting diode.

50. The organic light emitting diode according to claim 49, wherein at least one of the first and second barrier layers comprises a liner layer lining the top of the barrier layer to form a lined barrier layer.

51. The organic light emitting diode according to claim 50, wherein the liner layer is selected from a group comprising acrylic material, epoxy-based hard coat, silicon-based material and parylenes.

52. The organic light emitting diode according to claim 49, further comprising two additional barrier stacks, which are larger than the first and second barrier stacks and which are bonded together, serving as a package for the first and second barrier stacks.

53. The organic light emitting diode according to claim 49, wherein the active components are a functional stack and a protective organic layer is formed on the function stack, between the function stack and the second barrier stack.

54. The organic light emitting diode according to claim 53, wherein the protective organic layer is an acryl based hard coat.

55. The organic light emitting diode according to claim 53, wherein a third barrier layer is formed on the protective layer.

56. The organic light emitting diode according to claim 55, wherein the third barrier layer comprises a metal oxide.

57. The device according to claim 40, wherein:
the adhesive layer directly contacts the first base layer and the second base layer.

58. The device according to claim 40, wherein;
the adhesive layer directly contacts the first barrier layer of the first base layer and the third barrier layer of the second base layer.

59. The device according to claim 40, wherein:
at least one metal foil is arranged between the first base layer and the second base layer.

60. The device according to claim 40, wherein:
at the metal foil includes aluminum or copper.

* * * * *

UNITED STATES PATENT AND TRADEMARK OFFICE
CERTIFICATE OF CORRECTION

PATENT NO. : 6,737,753 B2  
DATED : May 18, 2004  
INVENTOR(S) : Ramadas Senthil Kumar et al.

It is certified that error appears in the above-identified patent and that said Letters Patent is hereby corrected as shown below:

Title page,  
Item [73], Assignees, replace "Osram Opto Semiconductor GmbH," with -- Osram Opto Semiconductors GmbH --

Column 4,  
Line 28, replace "second surfaces" with -- second surface --

Column 6,  
Line 37, replace "second surfaces" with -- second surface --  
Line 49, replace "second base layers" with -- second base layer --

Column 7,  
Line 38, replace "layer comprises is a high barrier" with -- layer comprises a high barrier --

Signed and Sealed this

Seventh Day of December, 2004

JON W. DUDAS  
*Director of the United States Patent and Trademark Office*